(12) United States Patent
Niimi et al.

(10) Patent No.: US 8,492,291 B2
(45) Date of Patent: Jul. 23, 2013

(54) FORMATION OF GATE DIELECTRICS WITH UNIFORM NITROGEN DISTRIBUTION

(75) Inventors: Hiroaki Niimi, Dallas, TX (US); Reima T. Laaksonen, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 13/236,121

(22) Filed: Sep. 19, 2011

(65) Prior Publication Data
US 2012/0149186 A1 Jun. 14, 2012

Related U.S. Application Data

(63) Continuation of application No. 11/229,115, filed on Sep. 16, 2005, now abandoned.

(51) Int. Cl.
*H01L 21/31* (2006.01)
*H01L 21/469* (2006.01)

(52) U.S. Cl.
USPC ..... 438/769; 438/771; 438/776; 257/E21.267

(58) Field of Classification Search
USPC ... 438/769, 771–772, 776–777; 257/E21.267
See application file for complete search history.

(56) References Cited

U.S. PATENT DOCUMENTS

| | | | |
|---|---|---|---|
| 6,459,562 B1 | 10/2002 | KarRoy et al. | |
| 6,730,566 B2 | 5/2004 | Niimi et al. | |
| 6,762,114 B1 | 7/2004 | Chambers | |
| 6,780,719 B2 | 8/2004 | Niimi et al. | |
| 6,893,979 B2 | 5/2005 | Khare et al. | |
| 2003/0118748 A1 | 6/2003 | Kumagai et al. | |
| 2003/0181060 A1 | 9/2003 | Asai et al. | |
| 2004/0038538 A1 | 2/2004 | Ho et al. | |
| 2004/0070046 A1 | 4/2004 | Niimi | |
| 2004/0129969 A1 | 7/2004 | Colombo et al. | |
| 2004/0185676 A1 | 9/2004 | Hasegawa | |
| 2005/0003618 A1 | 1/2005 | Kanda | |
| 2005/0124113 A1 | 6/2005 | Yoneda | |

*Primary Examiner* — Matthew Landau
*Assistant Examiner* — Daniel Luke
(74) *Attorney, Agent, or Firm* — Warren L. Franz; Wade J. Brady, III; Frederick J. Telecky, Jr.

(57) ABSTRACT

The present invention provides a method for manufacturing a gate dielectric (710) that includes providing a nitrided dielectric layer (220) over a substrate (120). The nitrided dielectric layer (220) has a nonuniform concentration of nitrogen in a bulk thereof. The nitrided dielectric layer (220) is exposed to oxygen radicals (410), resulting in a reduction of the nonuniformity.

22 Claims, 4 Drawing Sheets

FORMATION OF GATE DIELECTRICS WITH UNIFORM NITROGEN DISTRIBUTION

This application is a continuation of application Ser. No. 11/229,115, filed Sep. 16, 2005, the entirety of which is incorporated herein by reference.

BACKGROUND OF THE INVENTION

The present invention is directed, in general, to a method of forming a gate dielectric, and in particular, a method of forming a nitrided gate dielectric with a uniform distribution of nitrogen in the bulk thereof.

In certain semiconductor applications it is necessary to integrate dual gate oxide (DGO) thicknesses for associated transistor devices onto a single integrated circuit device. One motivation for performing dual gate oxide processing is that high performance transistors typically operate at lower voltages (e.g., 0.8 volts to 1.5 volts), and thus require thinner gate dielectric regions, whereas devices that interface with most conventional external peripherals typically require higher operating voltages (e.g., 1.8 volts to 3.5 volts), and thus require thicker gate dielectric regions. When interfacing lower voltage high performance metal-oxide-semiconductor field-effect-transistors (MOSFETs) within a core of an integrated circuit, to higher voltage peripheral devices, input and output (I/O) buffers of the integrated circuit (IC) are typically designed to contain thicker gate dielectric regions that are compatible with the higher external peripheral device voltages.

For example, current microcontroller units (MCUs) and digital signal processors (DSPs) are integrating several different types of technology onto a single integrated circuit, such as high speed logic, power logic, static random access memory (SRAM), nonvolatile memory (NVM), embedded dynamic random access memory (DRAM), analog circuitry, and other devices and technologies. Many of these devices require different gate dielectric processing and different gate dielectric thicknesses to provide both high performance lower voltage devices within the core of the device and higher voltage I/O devices to interface with external peripheral devices.

As stated above, a dual gate thickness structure includes thin gate dielectrics for high performance low voltage operation core devices, and thick gate dielectrics for low leakage high voltage operation I/O devices. High performance devices with thin gate dielectrics are prone to leakage as the gate thicknesses fall below about 1.2 nm. A well-established technique of mitigating the leakage current in a gate dielectric material such as silicon dioxide is to introduce nitrogen into the gate dielectric to raise the dielectric constant. This allows the use of a thicker gate dielectric where a thinner dielectric would ordinarily be needed, providing for less leakage through the gate dielectric. But nitridation is also beneficial for the performance of the I/O devices. For example, nitridation serves to suppress certain effects that decrease reliability, such as negative bias temperature instability (NBTI).

One method of nitrogen atom introduction includes performing non-thermal nitridation (e.g., plasma nitridation) on the gate dielectrics. Unfortunately, this and other methods of introducing the nitrogen atoms into the gate dielectrics are limited in the depth of nitrogen penetration in the gate dielectric material, resulting in non-uniform nitrogen concentration with increasing depth into the gate dielectric material. The non-uniformity, and thus reduced reliability, is particularly significant in thicker gate dielectrics, such as those used in the aforementioned high voltage devices.

Accordingly, what is needed in the art is a method for including nitrogen within a dielectric layer that will result in improved non-uniformity characteristics in the bulk region thereof.

SUMMARY OF THE INVENTION

To address the above-discussed deficiencies of the prior art, the present invention provides for a method of manufacturing a gate dielectric that includes providing a nitrided dielectric layer over a substrate, for which the nitrided dielectric layer has a non-uniformity of nitrogen in a bulk of the layer. The nitrided dielectric layer is exposed to oxygen radicals, thereby resulting in a reduction in the non-uniformity of nitrogen.

In another aspect, the present invention provides a method for manufacturing an integrated circuit. The method includes providing a nitrided dielectric layer over a substrate, where the nitrided dielectric layer has a non-uniformity of nitrogen in a bulk of the layer. The nitrided dielectric layer is exposed to oxygen radicals, resulting in a reduction in the non-uniformity of nitrogen. The method further includes forming a gate electrode layer over the nitrided dielectric layer, and patterning the gate electrode layer and the nitrided gate dielectric layer to form gate structures over the substrate. Interlevel dielectric layers are formed over the gate structures, and interconnects are formed within the dielectric layers to form an operational integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Turning to FIGS. 1-8, illustrated are cross-sectional views illustrating how one skilled in the art might manufacture a semiconductor device in accordance with the principles of the present invention. While FIGS. 1-8 are specifically directed to the manufacture of a semiconductor device, FIGS. 1-8 also illustrate, in a broad sense, how one skilled in the art might manufacture a gate dielectric with improved nitrogen uniformity, in accordance with the principles of the present invention. Thus, a method for manufacturing a gate dielectric is discussed within the confines of discussing how one skilled in the art might manufacture a semiconductor device with respect to FIGS. 1-8. Nevertheless, while each of these ideas is discussed and illustrated using a single set of FIGUREs, neither should be limiting on the other.

Figure 1:
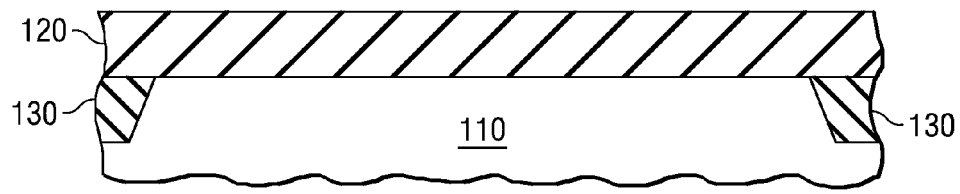
FIG. 1 illustrates a cross-section of a partially fabricated semiconductor device after formation of a dielectric layer on a substrate.

Referring initially to FIG. 1, illustrated is a cross-section of a partially fabricated semiconductor device 100 having a substrate 110 and a dielectric layer 120 formed thereover. The dielectric layer 120 is formed conventionally, and may be a silicon dioxide layer. The dielectric layer 120 may be formed by thermal oxidation, though any other suitable method is within the scope of the invention. The substrate 110 may be a conventional semiconductor, and may further be a semiconductor wafer suitable for semiconductor device manufacturing. An example of such a wafer is a 200 mm or 300 mm silicon wafer. Those skilled in the art will appreciate that such substrates 120 are available with many possible variations, including the semiconducting material (e.g., Si and GaAs), doping level, silicon-on-insulator, and substrates upon which an epitaxial layer, such as Si or silicon-germanium (Si—Ge), has been formed. Moreover, the substrate 110 may have been processed to provide a number of structural features and layers as part of an incomplete device manufacturing flow. In FIG. 1, for example, isolation structures 130 have been formed as part of a semiconductor device manufacturing flow. Moreover, the substrate 110 may have been previously processed by implantation of dopants to define NMOS and PMOS regions of the substrate 110. These and other similar variations in substrate type are all within the scope of the present invention.

Figure 2:
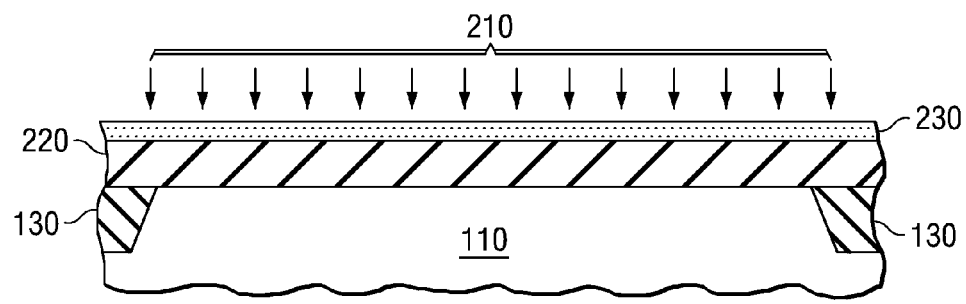
FIG. 2 illustrates the partially fabricated semiconductor device of FIG. 1 at a later stage of processing, at which the dielectric layer is exposed to a nitridation process.

Turning to FIG. 2, with continued reference to FIG. 1, illustrated is the partially fabricated semiconductor device 100 of FIG. 1 at a later stage of processing. In this FIGURE, the dielectric layer 120 of FIG. 1 is exposed to a conventional nitrogen source 210 to produce a nitrided dielectric layer 220. The nitrogen source 210 may be a nitrogen plasma under conditions suitable to result in the incorporation of nitrogen into the dielectric layer 120. Those skilled in the pertinent art are familiar with various suitable plasma nitridation processes. In one embodiment, the dielectric layer 120 is silicon dioxide, and after exposure to the nitrogen source 210, the nitrided dielectric layer 220 is silicon oxynitride, or SiON. Note that plasma nitridation results in a higher concentration of nitrogen in the portion of the nitrided dielectric layer 220 near the surface, and a lower concentration of nitrogen at some depth from the surface. This is illustrated in FIG. 2 as a nitrogen-rich layer 230, though those skilled in the art recognize that the nitrogen concentration decreases smoothly with depth of nitrogen penetration of the nitrided dielectric layer 220.

Figure 3:
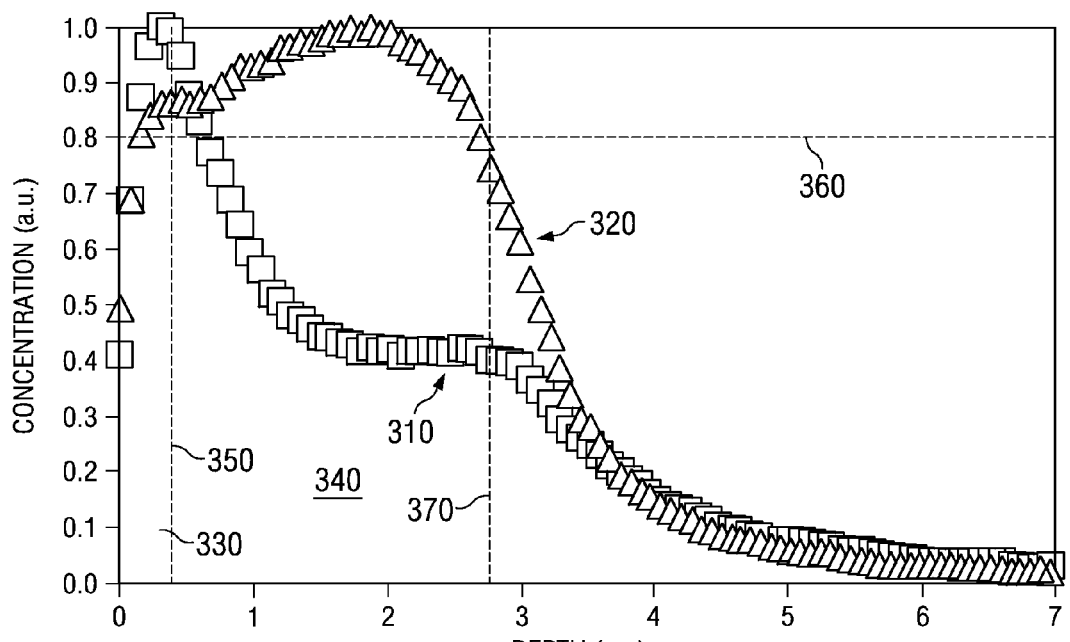
FIG. 3 presents a plot of the nitrogen and oxygen concentration in a SiON film produced by plasma nitridation of a thermally grown $SiO_2$ film.

Turning to FIG. 3, illustrated is a plot 300 of the nitrogen and oxygen concentration in a SiON film produced by plasma nitridation of a thermally grown $SiO_2$ film. This SiON film is representative of the nitrided dielectric layer 220, and will be referred to as such in the discussion of the plot 300. A nitrogen profile 310, portrayed as squares, shows the measured concentration of nitrogen, [N], with increasing depth in the nitrided dielectric layer 220. The nitrogen concentration was determined by time-of-flight secondary ion mass spectrometry (ToF-SIMS). The data have been normalized to set the maximum nitrogen concentration to an arbitrary value of unity, so the nitrogen concentration is expressed in arbitrary units (a.u.). The nitrogen profile 310 initially increases to a maximum of 1 a.u. at about 0.3 nm of depth, decreases to a relatively uniform concentration of about 0.4 a.u. between about 1.5 nm to about 3.0 nm, and then decreases to about zero at about 7 nm of depth. An oxygen profile 320, portrayed as triangles, has also been normalized. The oxygen profile 320 shows an initial increase of oxygen concentration that those skilled in the pertinent art appreciate is an artifact of the measurement technique, and may be disregarded in the present discussion. Thus qualified, the oxygen profile 320 has a relatively uniform value of between about 0.9 a.u. and about 1.0 a.u. up to about 2.5 nm depth, above which it decreases to zero at about 7 nm.

The nitrided dielectric layer 220 may be characterized as having a surface region 330 and a bulk region 340 that may be defined in relation to the surface of the nitrided dielectric layer 220 and the oxygen profile 320. The surface region 330 is defined to begin at the surface of the nitrided dielectric layer 220, and extend to a depth about 0.3 nm, as indicated by a line 350. The bulk region 340 extends from about 0.3 nm until the oxygen profile 320 decreases to about 90% of an average oxygen concentration within the bulk region 340, as indicated by a line 360. The depth corresponding to the intersection of the oxygen profile 320 and the line 360, as indicated by a line 370, is the lower extent of the bulk region 340, or about 2.8 nm in the plot 300. Those skilled in the art will appreciate that the thickness of the bulk region will depend on the total thickness of the nitrided dielectric layer 220.

A non-uniformity (N.U.) of the nitrogen concentration in the bulk region 340 may be defined to quantify differences between films. The definition applied in the context of the present invention is $$\% \ N.U. = \frac{[N]_{max} - [N]_{min}}{[N]_{avg}} * 100 \qquad (1)$$

For the purposes of the invention, a non-uniformity less than about 25% is considered to be substantially uniform. Thus defined, non-uniformity of the nitrogen concentration of the bulk region 340 of the nitrided dielectric layer 220 in the plot 300 is computed to be about 110%.

Figure 4:
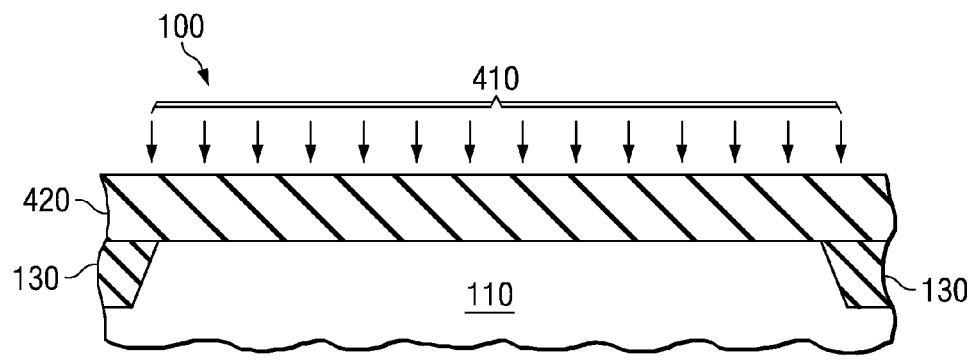
FIG. 4 illustrates the partially fabricated semiconductor device of FIG. 2 at a later stage of processing, in which the nitrided dielectric layer is exposed to oxygen radicals according to the principles of the invention.

Turning now to FIG. 4, with continued reference to FIG. 2, illustrated is the partially fabricated semiconductor device 100 of FIG. 2 at a later stage of processing, in which the nitrided dielectric layer 220 is treated according to the principles of the invention. Oxygen radicals 410 are used to reduce the concentration of nitrogen in a portion of the bulk of the nitrided dielectric layer 220 to reduce the non-uniformity of nitrogen. The processing of the nitrided dielectric layer 220 results in the formation of a treated dielectric layer 420.

The oxygen radicals 410 are formed in a manner that results in reduced non-uniformity of nitrogen of the treated dielectric layer 420 while minimizing potentially undesirable effects such as sputtering of the surface. In one embodiment, a low-temperature plasma containing oxygen is used to generate the oxygen radicals 410. The term "low-temperature" in the context of this invention is defined as maintaining the substrate 110 at a temperature ranging from about 200° C. to about 400° C. during exposure to the plasma. The conditions of the plasma are controlled to produce a concentration of oxygen radicals in the plasma sufficient to achieve the objective of reducing the nitrogen concentration near the surface of the nitrided dielectric layer 220, while minimizing undesirable effects. These objectives are advantageously attained using a microwave-coupled plasma with a pressure ranging from about 5 Pa to about 20 Pa, with an oxygen flow rate ranging from about 5 sccm to about 50 sccm, and an argon flow rate ranging from about 850 sccm to about 1250 sccm. The power of the microwave source is maintained at a value ranging from about 500 W to about 1500 W for a time period ranging from about 5 seconds to about 20 seconds. Those skilled in the art of plasma processing will appreciate that variations on this embodiment may be possible and remain within the scope of the invention. For example, the oxygen source may be $O_2$. Moreover, argon may be replaced by another gas, such as krypton (Kr) or xenon (Xe). These alternate embodiments may be used without changing the inventive principle of the exposure of the nitrided dielectric layer 220 to oxygen radicals.

Figure 5:
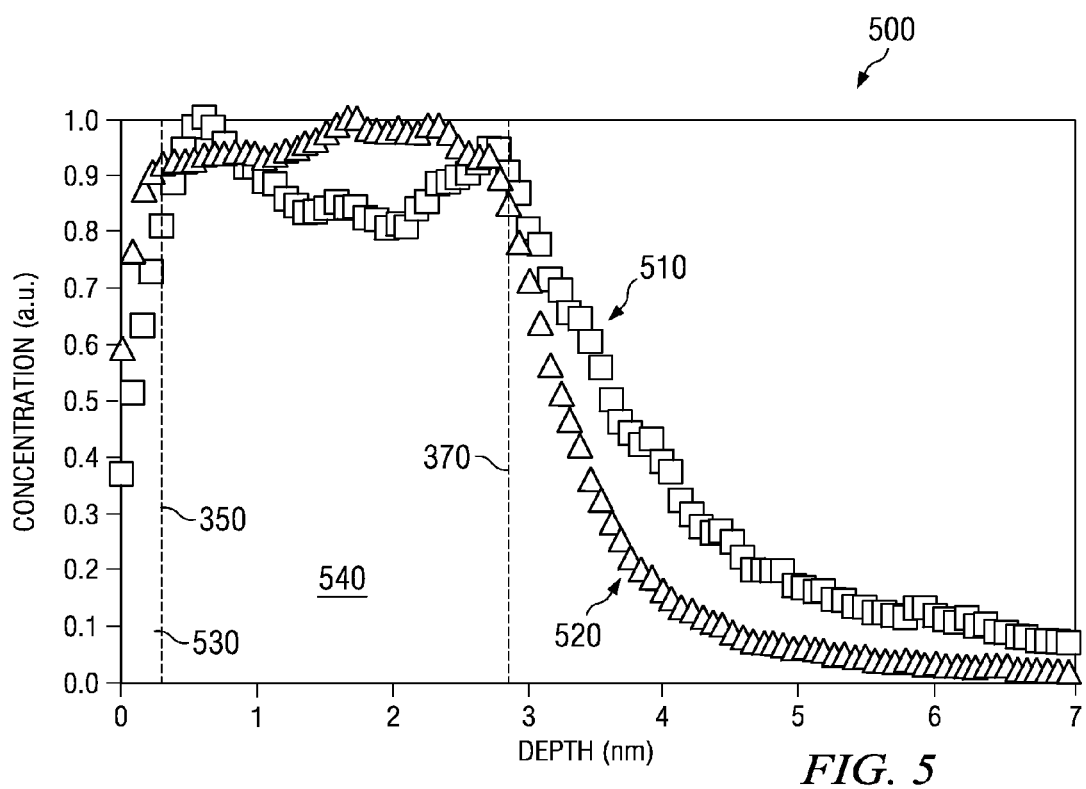
FIG. 5 illustrates a plot of the nitrogen and oxygen concentration in a SiON film exposed to oxygen radicals according to the principles of the invention.

Turning to FIG. 5, illustrated is a plot 500 of the normalized nitrogen and oxygen concentration with increasing depth in the SiON film of FIG. 3 having been subjected to the radical oxidation process as described above. This treated film is representative of the treated dielectric layer 420, and will be referred to as such in the discussion of the plot 500. As before, a nitrogen profile 510 is portrayed as squares, and an oxygen profile 520 is portrayed as triangles. Using the criteria set forth in the discussion of FIG. 3, a surface region 530 is defined as that portion of the treated dielectric layer 420 between the surface and a depth of 0.3 nm, as shown by the line 350. A bulk region 540 is between about 0.3 nm and about 2.8 nm of depth, as denoted by the line 370. Using Equation 1 to compute the non-uniformity of the concentration of nitrogen in the bulk region 540 of the treated dielectric layer 420 results in a value of about 22%.

The reduced non-uniformity of nitrogen in the treated dielectric layer 420 provides significant improvement over the 110% non-uniformity computed for the nitrided dielectric layer 220. The lower non-uniformity in the treated dielectric layer 420 can be expected to result in less charge trapping and gate leakage than for the nitrided dielectric layer 220. Thus, semiconductor devices and integrated circuits manufactured according to the principles of the invention can be expected to have increased gate breakdown voltage and operating lifetime.

Figure 6:
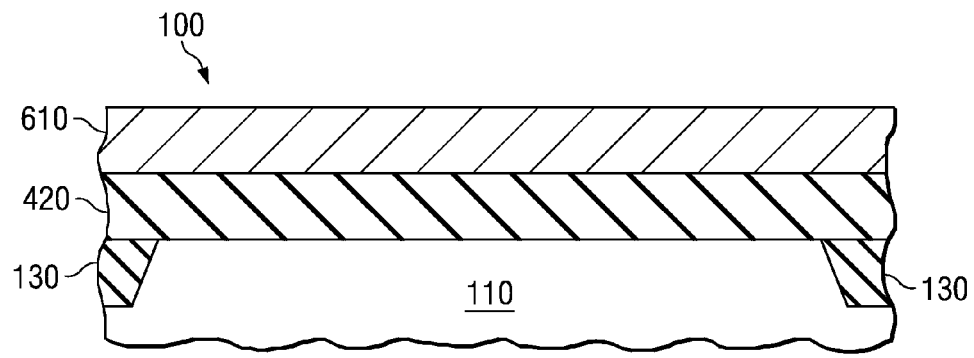
FIGS. 6 through 8 illustrate the partially fabricated semiconductor device of FIG. 4 at later stages in an exemplary method of manufacturing a semiconductor device according to the principles of the present invention.

Turning now to FIG. 6, illustrated is the partially fabricated semiconductor device 100 of FIG. 4 after conventional formation of a gate electrode layer 610 over the treated dielectric layer 420. The gate electrode layer 610 may be a semiconductor material such as polysilicon or other suitable gate material. In an alternate embodiment, a second dielectric layer is formed over the treated dielectric layer 420 prior to formation of the gate electrode layer 610. Such a second dielectric layer may be a result of processing of a dual-voltage integrated circuit, for example, resulting in high-voltage and low-voltage transistors on the same substrate.

Figure 7:
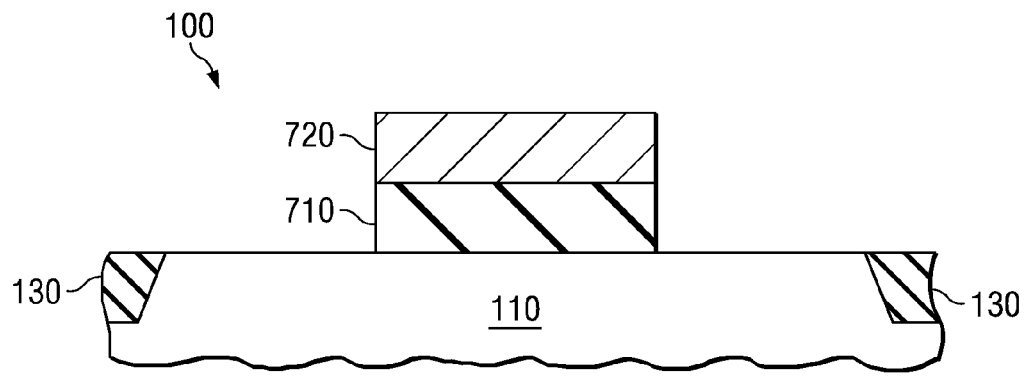

In FIG. 7, illustrated is the partially fabricated semiconductor device 100 of FIG. 5 after the gate electrode layer 610 and the treated dielectric layer 420 have been patterned by conventional means to form a gate dielectric 710 and a gate electrode 720. Such patterning typically includes a photolithography process and a plasma etch process. Those of ordinary skill in the art will appreciate that the plasma etch process will be tailored to the particular materials used for the gate electrode layer 610 and the treated dielectric layer 420.

Figure 8A:
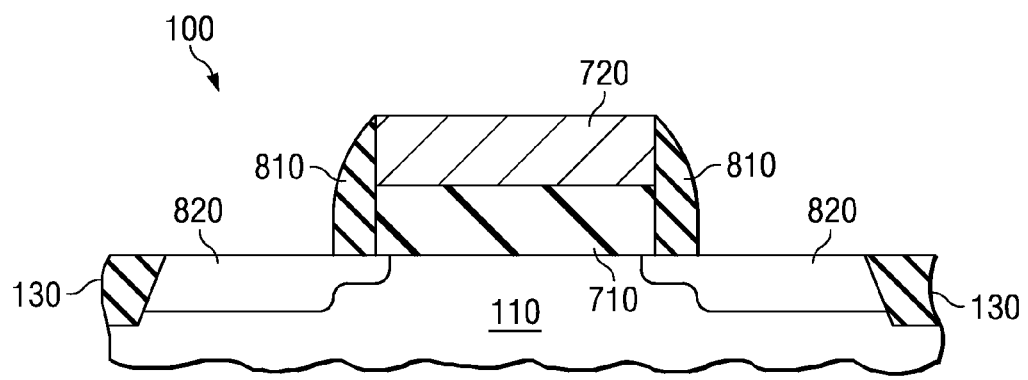

Briefly turning to FIG. 8A, illustrated is the semiconductor device 100 of FIG. 7 after formation of sidewall spacers 810 and source/drain regions 820. These elements of the semiconductor device 100 are formed by conventional means well known to those skilled in the pertinent arts. The gate dielectric 710 may be a single dielectric layer formed according to the principles of the invention.

Figure 8B:
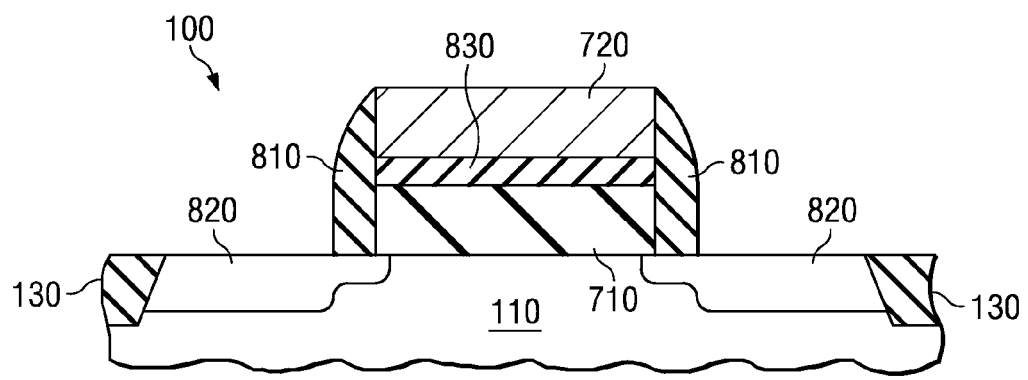

In FIG. 8B, the semiconductor device 100 of FIG. 7 comprises two dielectric layers. This embodiment illustrates a possible structure of a high voltage transistor in a dual-voltage integrated circuit. Those skilled in the art of dual-voltage device fabrication appreciate that the gate dielectrics of the high voltage transistors in such an IC are typically formed before the gate dielectrics for the low voltage transistors. Formation of the gate dielectrics of the low voltage transistors results in the formation of a second dielectric 830 over the gate dielectric 710, as illustrated in FIG. 8B.

Figure 9:
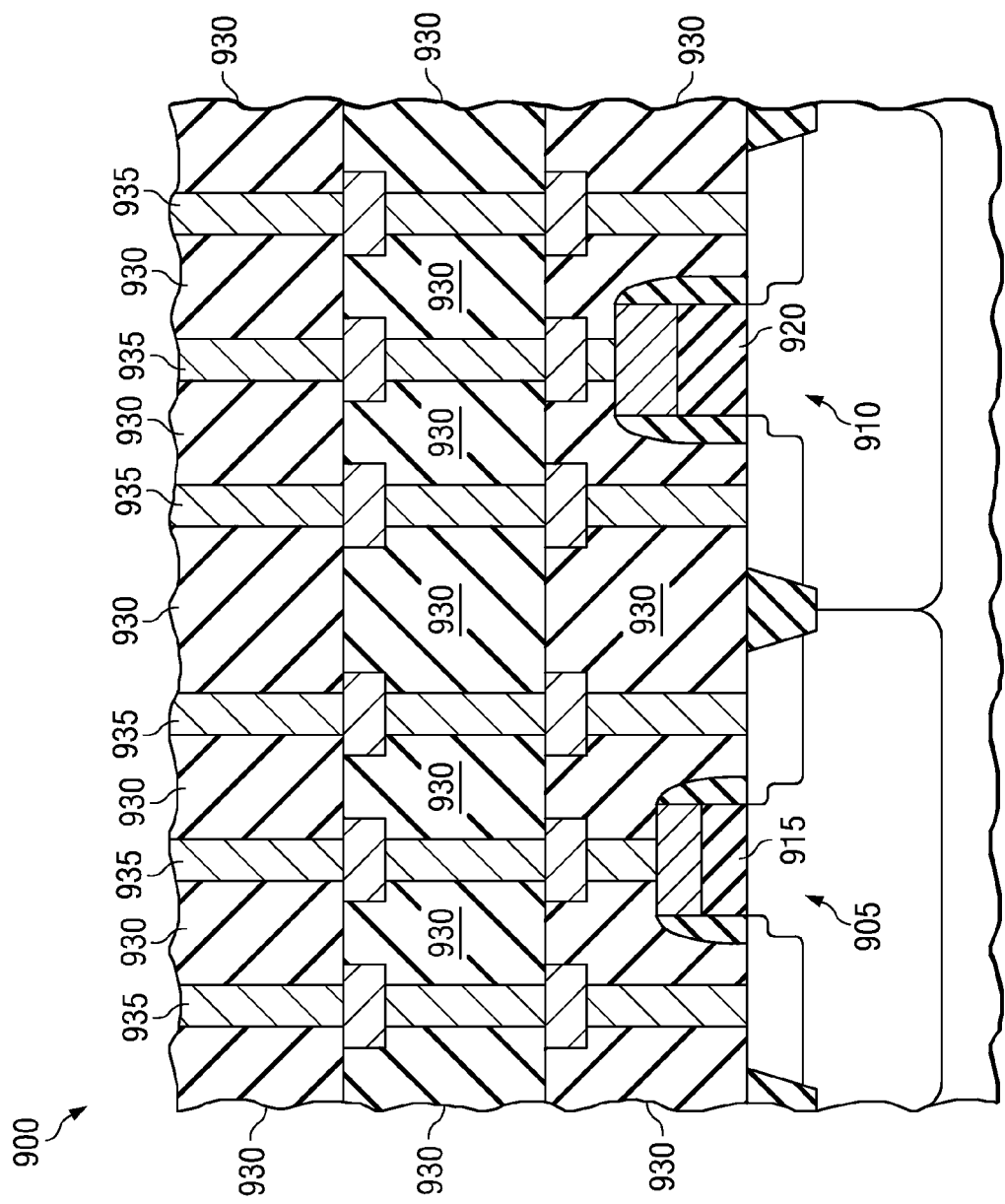
FIG. 9 illustrates a cross-section of an integrated circuit fabricated using gate dielectrics formed according to the principles of the present invention.

Finally, turning to FIG. 9, illustrated is an exemplary cross-sectional view of an integrated circuit (IC) 900 incorporating semiconductor devices 905, 910 having gate dielectrics 915, 920, respectively, formed according to the principles of the present invention. The IC 900 may include MOS, BiCMOS or bipolar components, and may further include passive components, such as capacitors, inductors or resistors. It may also include optical components or optoelectronic components. Those skilled in the art are familiar with these various types of components and their manufacture. The IC 900 may also be a dual-voltage IC, comprising transistors operating with difference threshold voltages. The particular embodiment illustrated in FIG. 9 is a dual-voltage IC, as reflected in the different thicknesses of gate dielectrics 915, 920.

Dielectric layers 930 are fabricated over the transistors 905, 910 using conventional means. Additionally, interconnect structures 935 are located within the dielectric layers 930 to interconnect various components, thus forming the operational integrated circuit 900. It will be apparent to one skilled in the art that several variations of the exemplary interconnect architecture may be fabricated according to the principles of the invention with similarly advantageous results.

Although the present invention has been described in detail, those skilled in the art should understand that they can make various changes, substitutions and alterations herein without departing from the spirit and scope of the invention in its broadest form.

What is claimed is:

1. A method of manufacturing a semiconductor device, comprising:
    forming a gate dielectric silicon dioxide layer by thermal oxidation over a substrate;
    incorporating nitrogen into the silicon dioxide layer to form a nitrided silicon oxide layer having a non-uniform depth distribution of nitrogen atoms, with a nitrogen concentration profile that increases in a surface region from a surface to a maximum at about a first depth, and then decreases to a relatively uniform concentration in a bulk region extending from the first depth to a second depth at which the nitrogen concentration profile reaches a relative uniform concentration; and treating the nitrided silicon oxide layer with oxygen radicals to reduce a nitrogen concentration near the surface and reduce a non-uniformity of nitrogen in the bulk region to less than about 25%, as determined by $$\% \ N.U. = \frac{[N]_{max} - [N]_{min}}{[N]_{avg}} * 100,$$

wherein % N.U. is the % non-uniformity of the nitrogen concentration in the bulk region, $[N]_{max}$ is the maximum concentration of nitrogen in the bulk region, $[N]_{min}$ is the minimum concentration of nitrogen in the bulk region, and $[N]_{avg}$ is the average concentration of nitrogen in the bulk region.

2. The method of claim 1, wherein nitrogen is incorporated into the silicon dioxide layer using a non-thermal nitridation.

3. The method of claim 2, wherein the non-thermal nitridation is a plasma nitridation.

4. The method of claim 3, wherein the nitrided silicon oxide layer is treated using a plasma containing oxygen with the substrate maintained at a temperature of about 200° C. to about 400° C. during exposure to the plasma.

5. The method of claim 4, wherein the plasma containing oxygen is a microwave coupled plasma with a pressure of about 5 Pa to about 20 Pa, an oxygen flow rate of about 5 sccm to about 50 sccm and a power of about 500 W to about 1500 W for a time period of about 5 seconds to about 20 seconds.

6. The method of claim 5, wherein the plasma containing oxygen includes an inert gas flow rate of about 850 sccm to about 1250 sccm.

7. The method of claim 6, wherein the inert gas comprises argon, krypton or xenon.

8. The method of claim 4, wherein the first depth is about 0.3 nm.

9. The method of claim 8, wherein the nitrogen concentration decreases to the relatively uniform concentration between a depth of about 1.5 nm and about 3.0 nm.

10. The method of claim 9, wherein the nitrogen concentration decreases to about zero at a depth of about 7 nm.

11. The method of claim 10, wherein the second depth is about 2.5 nm.

12. The method of claim 11, wherein the oxygen concentration decreases to zero at a depth of about 7 nm.

13. The method of claim 4, wherein the relatively uniform concentration is about 0.4 times the maximum.

14. The method of claim 13, wherein the nitrided silicon oxide layer has a greater than 100% non-uniformity of nitrogen in the bulk region.

15. The method of claim 14, further comprising forming a gate electrode layer over the treated nitrided silicon dioxide layer.

16. The method of claim 15, further comprising forming a second dielectric layer over the treated nitrided silicon dioxide layer prior to forming the gate electrode layer for a higher voltage transistor, but not for a lower voltage transistor.

17. The method of claim 16, wherein the higher voltage transistor is an input/output buffer transistor of an integrated circuit, and the lower voltage transistor is a core transistor of the integrated circuit.

18. A method of manufacturing a semiconductor device, comprising:

forming a gate dielectric silicon dioxide layer by thermal oxidation over a substrate;

incorporating nitrogen into the silicon dioxide layer with a nitrogen plasma to form a nitrided silicon oxide layer having a non-uniform depth distribution of nitrogen atoms, with a nitrogen concentration profile that increases in a surface region from a surface to a maximum at about a first depth, and then decreases to a relatively uniform concentration in a bulk region extending from the first depth to a second depth at which the nitrogen concentration profile reaches a relative uniform; the nitrided silicon oxide layer having a greater than 100% non-uniformity of nitrogen in the bulk region as determined by $$\% \ N.U. = \frac{[N]_{max} - [N]_{min}}{[N]_{avg}} * 100,$$

wherein % N.U. is the % non-uniformity of the nitrogen concentration in the bulk region, $[N]_{max}$ is the maximum concentration of nitrogen in the bulk region, $[N]_{min}$ is the minimum concentration of nitrogen in the bulk region, and $[N]_{avg}$ is the average concentration of nitrogen in the bulk region; and treating the nitrided silicon oxide layer with oxygen radicals using a plasma containing oxygen with the substrate maintained at a temperature of about 200° C. to about 400° C. during exposure to the plasma, to reduce a nitrogen concentration near the surface and reduce the non-uniformity of nitrogen in the bulk region to less than about 25%.

19. The method of claim 14, further comprising forming a second dielectric layer over the treated nitrided silicon dioxide layer for a higher voltage transistor but not for a lower voltage transistor; forming a gate electrode layer over the second dielectric layer for the higher voltage transistor; and forming the gate electrode layer over the treated nitrided silicon dioxide layer for the lower voltage transistor.

20. The method of claim 19, wherein the higher voltage transistor is an input/output buffer transistor of an integrated circuit, and the lower voltage transistor is a core transistor of the integrated circuit.

21. The method of claim 1, wherein the bulk region is a bulk region extending from the first depth to a second depth defined by a depth at which a corresponding oxygen concentration profile decreases to about 90% of an average concentration within the bulk region.

22. The method of claim 18, wherein the bulk region is a bulk region extending from the first depth to a second depth defined by a depth at which a corresponding oxygen concentration profile decreases to about 90% of an average concentration within the bulk region.

* * * * *